US009892912B2

(12) United States Patent
Yin et al.

(10) Patent No.: US 9,892,912 B2
(45) Date of Patent: Feb. 13, 2018

(54) METHOD OF MANUFACTURING STACKED NANOWIRE MOS TRANSISTOR

(71) Applicant: Institute of Microelectronics, Chinese Academy of Sciences, Beijing (CN)

(72) Inventors: Huaxiang Yin, Beijing (CN); Changliang Qin, Beijing (CN); Zuozhen Fu, Beijing (CN); Xiaolong Ma, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/688,788

(22) Filed: Apr. 16, 2015

(65) Prior Publication Data

US 2015/0228480 A1    Aug. 13, 2015

Related U.S. Application Data

(63) Continuation of application No. PCT/CN2013/080896, filed on Aug. 6, 2013.

(30) Foreign Application Priority Data

Oct. 16, 2012    (CN) .......................... 2012 1 0392511

(51) Int. Cl.
*H01L 21/336* (2006.01)
*H01L 21/02* (2006.01)
(Continued)

(52) U.S. Cl.
CPC .................. *H01L 21/02603* (2013.01); *H01L 21/823412* (2013.01); *H01L 21/823418* (2013.01);
(Continued)

(58) Field of Classification Search
CPC ....... H01L 21/02603; H01L 21/823418; H01L 21/823481; H01L 21/823412;
(Continued)

(56) References Cited

U.S. PATENT DOCUMENTS 7,663,166 B2 *   2/2010   Kim .................... H01L 29/0657
                                                   257/288
7,851,790 B2 *  12/2010   Rachmady ............ B82Y 10/00
                                                   257/250

(Continued)

FOREIGN PATENT DOCUMENTS

CN    102332451 A    1/2012
CN    102623321 A    8/2012

OTHER PUBLICATIONS

International Search Report and Written Opinion dated Nov. 14, 2013, issued in International Application No. PCT/CN2013/080896, filed Aug. 6, 2013.

*Primary Examiner* — Vu A Vu
(74) *Attorney, Agent, or Firm* — Knobbe Martens Olson & Bear LLP (57) ABSTRACT

Methods of manufacturing stacked nanowires MOS transistors are disclosed. In one aspect, the method includes forming a plurality of fins along a first direction on a substrate. The method also includes forming stack of nanowires constituted of a plurality of nanowires in each of the fins. The method also includes forming a gate stack along a second direction in the stack of nanowires, the gate stack surrounding the stack of nanowires. The method also includes forming source/drain regions at both sides of the gate stack, the nanowires between the respective source/drain regions constituting a channel region. A stack of nanowires may be formed by a plurality of etching back, laterally etching a trench and filling the trench. The laterally etching process includes isotropic dry etching having an
(Continued)

internally tangent and lateral etching, and a wet etching which selectively etches along respective crystallographic directions.

10 Claims, 6 Drawing Sheets

(51) Int. Cl.
| | |
|---|---|
| *H01L 29/00* | (2006.01) |
| *H01L 29/775* | (2006.01) |
| *H01L 29/06* | (2006.01) |
| *H01L 29/423* | (2006.01) |
| *H01L 29/786* | (2006.01) |
| *H01L 21/8234* | (2006.01) |

(52) U.S. Cl.
CPC ......... *H01L 21/823431* (2013.01); *H01L 21/823481* (2013.01); *H01L 29/00* (2013.01); *H01L 29/0673* (2013.01); *H01L 29/42392* (2013.01); *H01L 29/775* (2013.01); *H01L 29/78696* (2013.01)

(58) Field of Classification Search
CPC ....... H01L 21/823431; H01L 29/78696; H01L 29/42392; H01L 29/775; H01L 29/0673; H01L 29/00
USPC ...................................... 438/283; 257/44, 24
See application file for complete search history.

(56) References Cited

U.S. PATENT DOCUMENTS

| | | | |
|---|---|---|---|
| 7,935,599 B2* | 5/2011 | Crowder | B82Y 10/00 257/E21.635 |
| 8,084,308 B2* | 12/2011 | Chang | H01L 27/1203 257/24 |
| 2010/0295022 A1* | 11/2010 | Chang | B82Y 10/00 257/24 |
| 2011/0309332 A1* | 12/2011 | Chang | B82Y 10/00 257/24 |
| 2012/0007051 A1* | 1/2012 | Bangsaruntip | B82Y 10/00 257/24 |
| 2012/0132989 A1 | 5/2012 | Haensch et al. | |

\* cited by examiner

Fig. 14

METHOD OF MANUFACTURING STACKED NANOWIRE MOS TRANSISTOR

RELATED APPLICATIONS

This application claims priority to International Application No. PCT/CN2013/080896, filed on Aug. 6, 2013, entitled "METHOD FOR MANUFACTURING STACKED NANO-WIRE MOS TRANSISTOR," and Chinese Patent Application No. 201210392511.3, filed on Oct. 16, 2012, entitled "METHOD OF MANUFACTURING STACKED NANOWIRE MOS TRANSISTOR", which are incorporated herein by reference in their entirety.

BACKGROUND

Field

The disclosed technology relates to methods of manufacturing semiconductor devices, and particularly to methods of manufacturing stacked nanowires MOS transistors.

Description of the Related Technology

Higher density semiconductor manufacturing, with corresponding decreases to sub-20 nm scale fabrication of metal oxide semiconductor field effect transistor (MOSFET) devices, led to development of three dimensional multi-gate such as fin field effect transistors (FinFET) and tri-gate devices. FinFET and tri-gate devices enhance gate control, suppress current leakages, and reduce short-channel effects, when compared to conventional single-gate silicon (Si) or silicon on insulator (SOI) MOSFETs with a dual gate SOI arrangement, by suppressing short-channel effects and drain induced barrier lowering (DIBL) effects, which has a lower junction capacitance and may implement a light-doping of the channel. A threshold voltage may be adjusted by setting a work function of the metal gate so that a driving current which is about two times larger may be obtained, and decrease requirements for an equivalent oxide thickness (EOT). As compared with a dual-gate device, in a tri-gate device, the gate surrounds a top surface and two side surfaces of the channel region, and the ability of gate control is further enhanced.

Further advantages may be possible with gate-all-around nanowires multi-gate devices with better gate control more effective suppression of short channel effects, and advantages in the scale-down process for a sub 14 nm technique. However, sufficient driving current can't be provided in an equivalent silicon area due to smaller conductive channels.

For example, for a device with an equivalent line width of about 1 μm, the dimensions of the gate-all-around nanowires device need to meet the following requirements: $d*n+(n-1)*s=1$ μm and $\pi*d*n>1$ μm, in which d is a diameter of a single nanowire, n is the number of nanowires, and s is the interval (spacing) between the nanowires. Thus, for diameters of about 3, 5, 7 and 10 nm, the intervals between the nanowires have to be smaller than 6.4 nm, 10.6 nm, 15 nm and 21.4 nm, respectively. To obtain a gate width which is equivalent to that of bulk silicon of about 1 μm, the parallel arrangements of the nanowires device should be more compact. Based on the current exposure and etching technique for FinFET (the intervals between the fins is about 60 nm), it is difficult to manufacture a stereo arrangements for such a nanowires with tiny intervals.

One way to increase the driving current of a transistor is to implement a stack of gate-all-around nanowires arrangement along a vertical direction. However, attempts to implement a stack of gate-all-around nanowires have not been compatible with conventional manufacturing processes, and have been costly. For example, an existing approach for making stacked nanowires is to grow alternating layers of Si and SiGe, by a method of heterochronous epitaxial growth on a buried oxide (BOX) layer, and selectively remove SiGe by a method such as wet etching so as to leave a stack of Si nanowires. Such a method is seriously limited by the quality of epitaxial grown thin layers and greatly increases the cost.

Therefore, there is a need for nanowires MOS transistor devices, and methods to manufacture nanowires MOS transistors for which the equivalent width of the conductive channel is increased, and the driving current is enhanced.

SUMMARY OF CERTAIN INVENTIVE ASPECTS

The disclosed technology includes nanowires MOS transistors devices and methods to manufacture nanowires MOS transistors for which the equivalent width of the conductive channel is increased, and the driving current is enhanced.

One aspect of the disclosed technology is a method of manufacturing stacked nanowires MOS transistors. The method includes forming a plurality of fins along a first direction on a substrate. The method further includes forming a stack of nanowires constituted of a plurality of nanowires in each of the fins. The method further includes forming a gate stack along a second direction in the stack of nanowires, the gate stack surrounding the stacked nanowires. The method further includes forming source/drain regions at both sides of the gate stack, the nanowires between the respective source/drain regions constituting a channel region.

In an embodiment, forming a stack of nanowires includes depositing a shallow trench isolation (STI) between the fins. In an embodiment, forming a stack of nanowires further includes etching back the shallow trench isolation to expose a first portion on top of the fin. In an embodiment, forming the a stack of nanowires further includes laterally etching the first portion on top of the fins to form a punched-through first recess, the remaining portion of the first portion on top of the fins forming a first nanowires. In an embodiment, forming the stack of nanowires further includes depositing a first protective layer to fill at least the first recess.

In an embodiment, after forming the first nanowires, the method further includes anisotropically etching back the first protective layer and the shallow trench isolation to expose a second portion in a middle portion of the fins. In an embodiment, after forming the first nanowires, the method further includes laterally etching the second portion in the middle portion of the fins to form a punched through second recess, the remaining portion of the second portion in the fins constituting the second nanowires. In an embodiment, after forming the first nanowires, the method further includes depositing a second protective layer to fill at least the second recess. In an embodiment, after forming the first nanowires, the method further includes and repeating the above steps to form a plurality of nanowires.

In an embodiment, a shape for the first recess and/or the second recess may be one of a rectangle, a trapezoid, a reversed trapezoid, a "Σ" shape, a "D" shape, a "C" shape, and/or a combination thereof.

In an embodiment, laterally etching the fins comprises an isotropic plasma dry etching having a lateral etching depth, or a combination of isotropic etching and anisotropic etching.

In an embodiment, laterally etching the fins comprises a wet etching which utilizes a selective etching along different crystallographic directions, which includes an etching of tetramethylammonium hydroxide (TMAH).

In an embodiment, the material for the first protective layer and/or the second protective layer is different from that of the shallow trench isolation.

In an embodiment, after forming the plurality of nanowires, the method further comprises removing the first and/or second protective layers to expose the plurality of nanowires. In an embodiment, after forming the plurality of nanowires, the method further comprises implementing a surface process and a sphering process on the stack of nanowires.

In an embodiment, the gate stack is a dummy gate stack for a gate-last process.

In an embodiment, after forming the source/drain region, the method further comprises depositing an inter-layer dielectric layer. In an embodiment, after forming the source/drain region, the method further comprises etching to remove the dummy gate stack to leave a gate trench. In an embodiment, after forming the source/drain region, the method further comprises depositing a gate stack in the gate trench.

In an embodiment, forming the source/drain regions further comprises forming a mask in the middle portion of the stack of nanowires. In an embodiment, forming the source/drain regions further comprises etching the nanowires along the second direction until the substrate is exposed. In an embodiment, forming the source/drain regions further comprises selectively epitaxial growing raised-up source/drain regions on the substrate.

In an embodiment, after forming the first and/or second protective layers, the method further comprises anisotropically etching the protective layers to expose the first and/or second nanowires and the shallow trench isolation.

Another aspect of the disclosed technology is a stacked nanowires MOS transistor manufactured by the method as mentioned above. The stacked nanowires MOS transistor includes a plurality of stacks of nanowires extending along a first direction on a substrate. The stacked nanowires MOS transistor further includes a plurality of metal gates extending along a second direction and across each of the stacks of nanowires. The stacked nanowires MOS transistor further includes a plurality of source/drain regions at both sides of the stack of nanowires extending along the first direction. The stacked nanowires MOS transistor further includes a plurality of channel regions constituted of the stack of nanowires between the respective source/drain regions. The stacked nanowires MOS transistor further includes a metal gate surrounding the channel region.

In an embodiment, the method of manufacturing a stacked nanowires MOS transistor forms a stack of nanowires by a plurality of etching back, laterally etching a trench and filling the trench, which increases an equivalent width of a conductive channel at a lower cost and increases the driving current.

BRIEF DESCRIPTION OF THE DRAWINGS

The foregoing and other objects, features, and advantages of the disclosed technology will become more apparent from the following description of embodiments when read in conjunction with the accompanying drawings.

DETAILED DESCRIPTION OF CERTAIN EMBODIMENTS

The features and technical effect of the technical solutions of the disclosed technology will be described below with exemplary schematic embodiments in connection with accompanying drawings, which discloses stacked nanowires MOS transistor and methods of manufacturing the same, which fully increases an equivalent width of a conductive channel so as to increase the driving current. It should be noted that similar reference signs indicate similar structures. In the disclosed technology, the terms of "first", "second", "upper", "lower" and so on are used to explain the respective arrangements of various devices or the order of manufacturing. Unless stated specifically, such terms is not intended to indicate the space, order or levels of the device arrangement or process of manufacturing.

Figure 13:
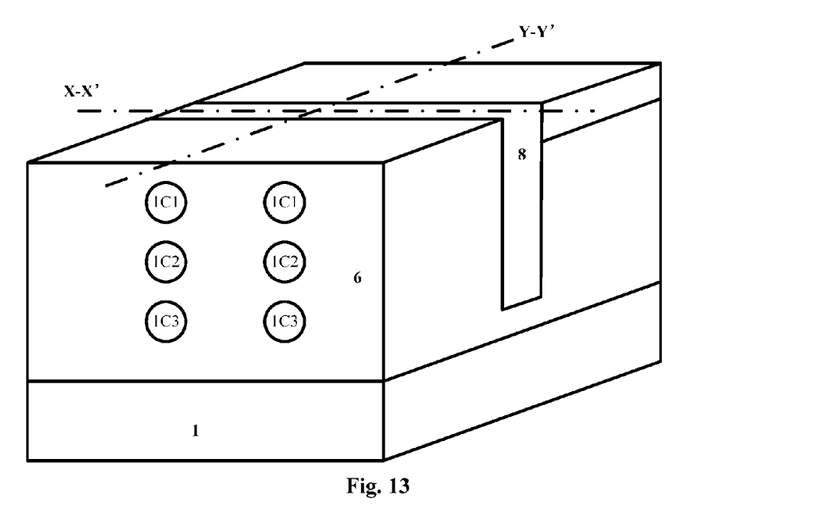
FIG. 13 is a stereo schematic view of a stacked nanowires MOSFET device according to the disclosed technology.

FIG. 13 is a stereo schematic view of stacked nanowires MOS transistor devices manufactured according to the disclosed technology. The stacked nanowires MOS transistor comprises: a plurality of stacks of nanowires extending along a first direction on a substrate; a plurality of metal gates extending along a second direction and across each of the stack of nanowires; a plurality of source/drain regions at both sides of the stack of nanowires extending along the first direction; a plurality of channel regions constituted of the stack of nanowires between the respective source/drain regions; characterized by that metal gate surrounding the channel region.

FIGS. 1A-12B illustrate schematic cross sectional views of certain steps of an embodiment of manufacturing stacked nanowires MOS transistors, such as the device illustrated in FIG. 13. FIGS. 1A-12B illustrate schematic cross-sectional views of an embodiment of manufacturing stacked nanowires MOS transistors, such as the device illustrated in FIG. 13.

Figure 1A:
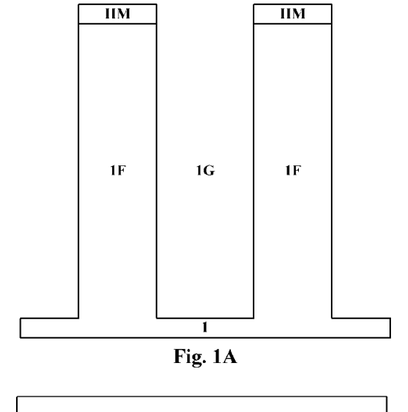
FIG. 1A is a cross sectional view, in a direction perpendicular to the channel direction, during an intermediate step of the method of manufacturing a stacked nanowires MOS transistor according to an embodiment of the disclosed technology.
Figure 1B:
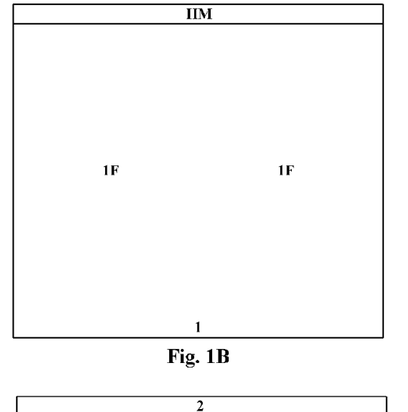
FIG. 1B is a cross sectional view, in a direction parallel to the channel direction, during an intermediate step of the method of manufacturing the stacked nanowires MOS transistor, corresponding to the intermediate step illustrated in FIG. 1A, according to an embodiment of the disclosed technology.

FIG. 1A is a cross sectional view, in a direction perpendicular to the channel direction (along the second direction), during an intermediate step of the method of manufacturing a stacked nanowires MOS transistor according to an embodiment of the disclosed technology. FIG. 1B is the corresponding cross sectional view in a direction parallel to the channel direction (along the first direction). By referring to FIG. 1A and FIG. 1B, a plurality of fins along a first direction is formed, in which the first direction is an extending direction of a channel region for the device formed according to the disclosed technology. A substrate 1 is provided, which may be reasonably selected according to usage of the device. The substrate 1 may comprise a material selected from a group constituted of monocrystalline silicon (Si), monocrystalline germanium (Ge), strained silicon (strained Si), germanium silicon (GeSi), or a compound semiconductor such as gallium nitride (GaN), gallium arsenide (GaAs), indium phosphide (InP) and indium antimonide (InSb), and carbon-based semiconductor such as Graphene, silicon carbide (SiC), carbon nano-tube and so on. In consideration of compatibility with CMOS process, the substrate 1 may be bulk silicon. A photolithography and etching is implemented on the substrate 1 so as to form a plurality of trenches 10 distributed in parallel along a first direction and the remaining material of the substrate 1 between the trenches 1G form the fins 1F. In an embodiment, a depth-width ratio of the trench 1G is larger than 5:1. In an embodiment, a hard mask layer HM is deposited on top of the plurality of fins and its material may be one selected from a group constituted of silicon oxide, silicon nitride, silicon oxynitride and combination thereof. In an embodiment, the material is silicon nitride.

Figure 2A:
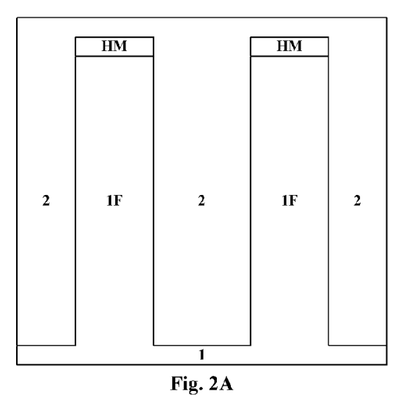
FIG. 2A is a cross sectional view, in a direction perpendicular to the channel direction, during an intermediate step of the method of manufacturing a stacked nanowires MOS transistor according to an embodiment of the disclosed technology.
Figure 2B:
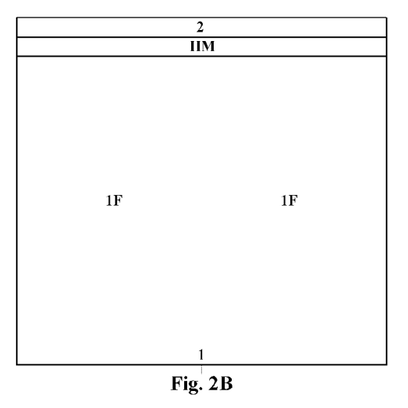
FIG. 2B is a cross sectional view, in a direction parallel to the channel direction, during an intermediate step of the method of manufacturing the stacked nanowires MOS transistor, corresponding to the intermediate step illustrated in FIG. 2A, according to an embodiment of the disclosed technology.

FIG. 2A is a cross sectional view, in a direction perpendicular to the channel direction (along a second direction), during an intermediate step of the method of manufacturing a stacked nanowires MOS transistor according to an embodiment of the disclosed technology. FIG. 2B is the corresponding cross sectional view in a direction parallel to the channel direction (along a first direction). By referring to FIGS. 2A and 2B, a filling material such as silicon oxide, silicon oxynitride, silicon oxycarbide, low-k insulating dielectric and so on are deposited in the trenches 1G between the fins 1F by a process such as plasma enhanced chemical vapor deposition (PECVD), high density plasma chemical vapor deposition (HDPCVD), RTO (rapid thermal oxidation), so that a shallow trench isolation (STI) 2 is formed.

Figure 3A:
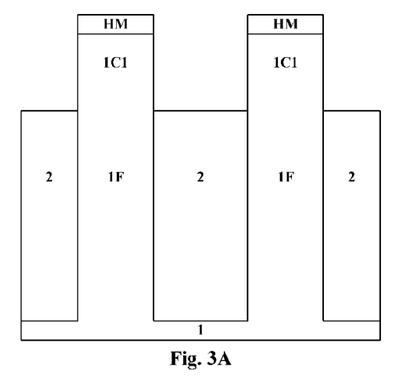
FIG. 3A is a cross sectional view, in a direction perpendicular to the channel direction, during an intermediate step of the method of manufacturing a stacked nanowires MOS transistor according to an embodiment of the disclosed technology.
Figure 3B:
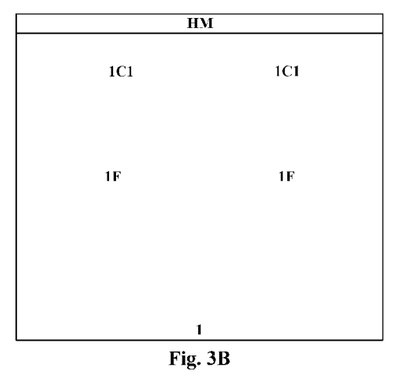
FIG. 3B is a cross sectional view, in a direction parallel to the channel direction, during an intermediate step of the method of manufacturing the stacked nanowires MOS transistor, corresponding to the intermediate step illustrated in FIG. 3A, according to an embodiment of the disclosed technology.

FIG. 3A is a cross sectional view, in a direction perpendicular to the channel direction (along a second direction), during an intermediate step of the method of manufacturing a stacked nanowires MOS transistor according to an embodiment of the disclosed technology. FIG. 3B is a corresponding cross sectional view in a direction parallel to the channel direction (along a first direction). By referring to FIGS. 3A and 3B, the shallow trench isolation STI 2 is etched back to expose a top of the fins 1. For the STI 2 of silicon oxide, it may be removed by a utilizing a hydrogen fluoride (HF)-based wet etching and may be also removed by a fluorine-based plasma dry etching. The STI 2 is etched downwards to expose a top portion 1C of the fins 1F, which portion functions as a channel region for the device. In particular, the top portion is the topmost layer of the stack of nanowires. The remaining middle portion is configured to form a plurality of nanowires channel regions in the subsequent procedure. The bottommost portion is etched to function as an isolation region for the device. In an embodiment, the exposed top portion 1C of the fins 1F is higher than ⅕-⅓ of the whole height of the fins 1F so as to form at least 3-5 nanowires.

Figure 4A:
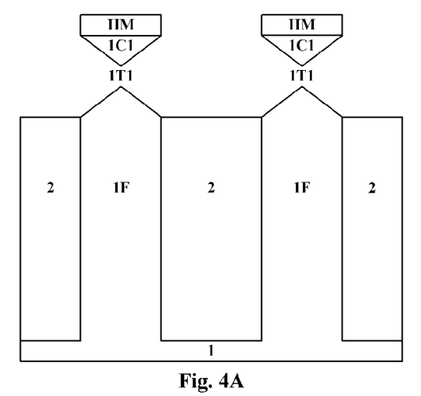
FIG. 4A is a cross sectional view, in a direction perpendicular to the channel direction, during an intermediate step of the method of manufacturing a stacked nanowires MOS transistor according to an embodiment of the disclosed technology.
Figure 4B:
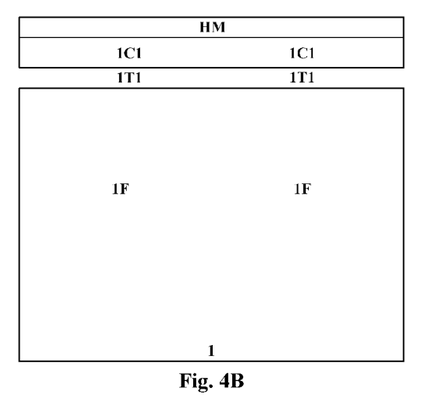
FIG. 4B is a cross sectional view, in a direction parallel to the channel direction, during an intermediate step of the method of manufacturing the stacked nanowires MOS transistor, corresponding to the intermediate step illustrated in FIG. 4A, according to an embodiment of the disclosed technology.

FIG. 4A is a cross sectional view, in a direction perpendicular to the channel direction (along a second direction), during an intermediate step of the method of manufacturing a stacked nanowires MOS transistor according to an embodiment of the disclosed technology. FIG. 4B is a corresponding cross sectional view in a direction parallel to the channel direction (along a first direction). By referring to FIGS. 4A and 4B, the top portion 1C of the fins 1F is etched along a first direction to form a first recess 1T1 and to expose the top portion of 1C of the fins 1F over the STI 2, which will form one portion of the channel region in the top layer. The shape of the sidewalls of the first recess 1T1 may be one of a rectangle, a trapezoid, a reversed trapezoid, a shape of "Σ" (which is connected together by a plurality of polylines), a shape of "C" (exceeding one half of a curved surface, the curved surface may be one of circular surface, ellipsoid and hyperboloid) and a shape of "D" (equal to one half of a curved surface, the curved surface may be one of circular surface, ellipsoid and hyperboloid). For different materials, the etching methods may be a fluorine-based or chlorine-based plasma dry etching or a TMAH wet etching. In an embodiment, the first recess 1T1 is punched through along a first direction, so that the topmost portion 1C1 of the fins 1F is isolated from the other portions so as to form a carbon nanotube in the topmost layer.

Figure 5A:
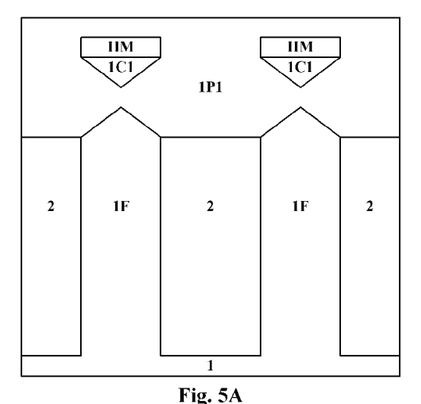
FIG. 5A is a cross sectional view, in a direction perpendicular to the channel direction, during an intermediate step of the method of manufacturing a stacked nanowires MOS transistor according to an embodiment of the disclosed technology.
Figure 5B:
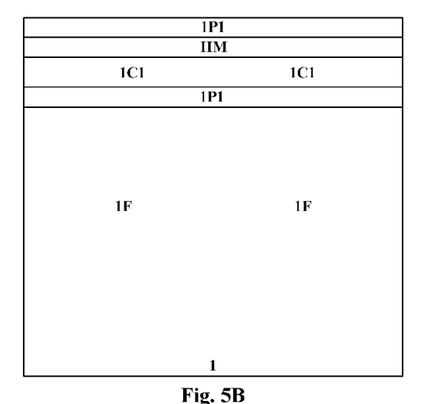
FIG. 5B is a cross sectional view, in a direction parallel to the channel direction, during an intermediate step of the method of manufacturing the stacked nanowires MOS transistor, corresponding to the intermediate step illustrated in FIG. 5A, according to an embodiment of the disclosed technology.

FIG. 5A is a cross sectional view, in a direction perpendicular to the channel direction (along a second direction), during an intermediate step of the method of manufacturing a stacked nanowires MOS transistor according to an embodiment of the disclosed technology. FIG. 5B is a corresponding cross sectional view in a direction parallel to the channel direction (along a first direction). By referring to FIGS. 5A and 5B, a first protective layer 1P1 is deposited on the whole device, the material of which may be one selected from a group constituted of silicon oxide, silicon nitride, amorphous silicon, amorphous germanium, amorphous carbon and any combination thereof. In an embodiment, the material of the first protective layer is distinct from that of the STI 2 so as to avoid being accidentally removed during the subsequent etching process.

Figure 6A:
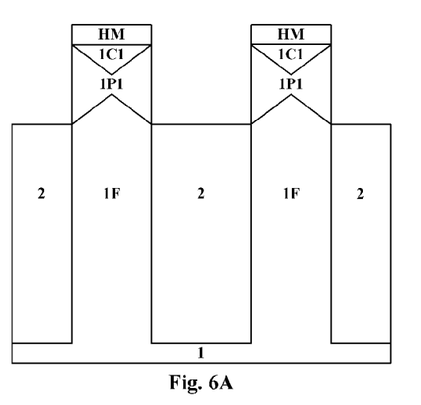
FIG. 6A is a cross sectional view, in a direction perpendicular to the channel direction, during an intermediate step of the method of manufacturing a stacked nanowires MOS transistor according to an embodiment of the disclosed technology.
Figure 6B:
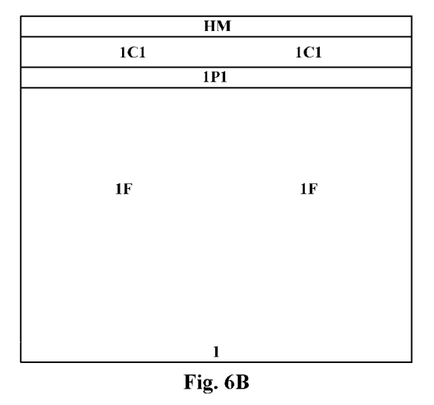
FIG. 6B is a cross sectional view, in a direction parallel to the channel direction, during an intermediate step of the method of manufacturing the stacked nanowires MOS transistor, corresponding to the intermediate step illustrated in FIG. 6A, according to an embodiment of the disclosed technology.

FIG. 6A is a cross sectional view, in a direction perpendicular to the channel direction (along a second direction), during an intermediate step of the method of manufacturing a stacked nanowires MOS transistor according to an embodiment of the disclosed technology. FIG. 6B is a corresponding cross sectional view. By referring to FIGS. 6A and 6B, the first protective layer 1P1 is anisotropically etched to expose the top nanowires 1C1 and the STI 2. The anisotropic etching method may be a carbon-fluorine-hydrogen based gas plasma etching and the composition of the etching gas may be adjusted so that the STI 2, e.g. silicon oxide, is hardly to be etched and only the first protective layer 1P1 of silicon nitride is etched.

Figure 7A:
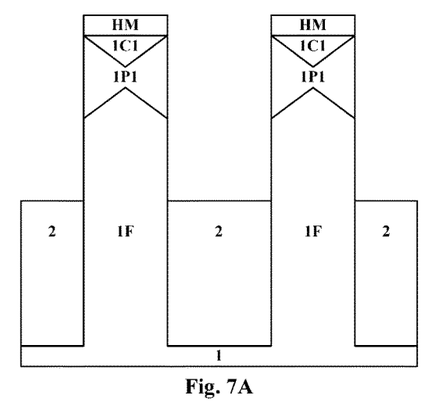
FIG. 7A is a cross sectional view, in a direction perpendicular to the channel direction, during an intermediate step of the method of manufacturing a stacked nanowires MOS transistor according to an embodiment of the disclosed technology.
Figure 7B:
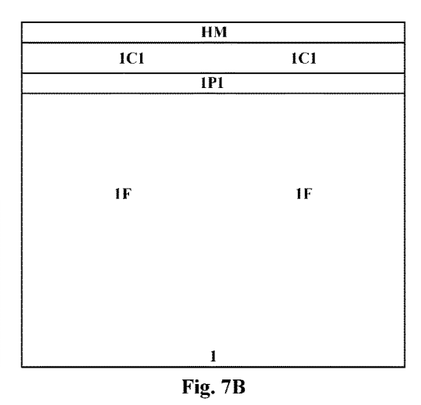
FIG. 7B is a cross sectional view, in a direction parallel to the channel direction, during an intermediate step of the method of manufacturing the stacked nanowires MOS transistor, corresponding to the intermediate step illustrated in FIG. 7A, according to an embodiment of the disclosed technology.

FIG. 7A is a cross sectional view, in a direction perpendicular to the channel direction (along a second direction), during an intermediate step of the method of manufacturing a stacked nanowires MOS transistor according to an embodiment of the disclosed technology. FIG. 7B is a corresponding cross sectional view in a direction parallel to the channel direction (along a first direction). By referring to FIGS. 7A and 7B which is similar to those of FIGS. 3A and 3B, the shallow trench isolation STI 2 is etched back to expose a top of the fin 1F. The STI 2 of silicon oxide may be removed by a utilizing a HF-based wet etching and may be also removed by a fluorine-based plasma anisotropic dry etching. The STI 2 is etched downwards to expose a middle portion 1C2 of the fins 1F, which middle portion 1C2 functions as a channel region for the device. In particularly, the middle portion is the middle layers of the stack of nanowires. The remaining bottom portion is configured to function as an isolation region for the device. The bottommost portion is etched to function as an isolation region for the device. In an embodiment, the exposed middle portion 1C2 of the fins 1F is higher than ⅕-⅓ of the whole height of the fins 1F so as to form at least 3-5 nanowires.

Figure 8A:
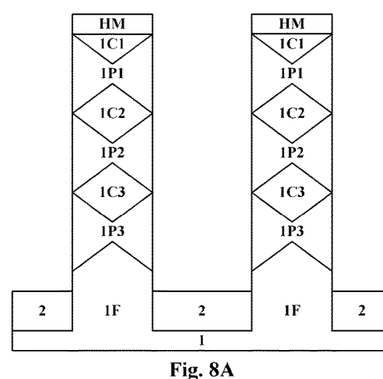
FIG. 8A is a cross sectional view, in a direction perpendicular to the channel direction, during an intermediate step of the method of manufacturing a stacked nanowires MOS transistor according to an embodiment of the disclosed technology.
Figure 8B:
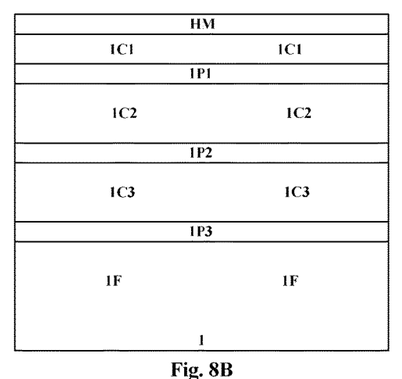
FIG. 8B is a cross sectional view, in a direction parallel to the channel direction, during an intermediate step of the method of manufacturing the stacked nanowires MOS transistor, corresponding to the intermediate step illustrated in FIG. 8A, according to an embodiment of the disclosed technology.

Subsequently, the above steps are repeated, e.g. as shown in FIG. 4A-FIG. 6B, by etching to form a second recess 1T2, depositing a second protective layer 1P2, anisotropically etching back the STI 2 to expose a middle portion 1C3 of the fins 1F, etching to form a third recess 1T3, depositing a third protective layer 1P3, anisotropically etching the third protective layer 1P3, finally forming the structure as shown in FIG. 8A and FIG. 8B. FIG. 8A is a cross sectional view, in a direction perpendicular to the channel direction (along a second direction), during an intermediate step of the method of manufacturing a stacked nanowires MOS transistor according to an embodiment of the disclosed technology. FIG. 8B is a corresponding cross sectional view in a direction parallel to the channel direction (along a first direction). Other embodiments may repeat the steps shown in FIG. 4A-FIG. 6B fewer or more than times. Such a structure comprises a plurality of fins on the substrate 1, each of which comprises a stack of nanowires formed by stacking the nanowires of 1C1, 1C2, 1C3 and so on, and in which each of the nanowires are isolated from each other by the protective layers 1P1, 1P2, 1P3 and so on. The top portion of the fins is a hard mask layer HM.

Figure 9A:
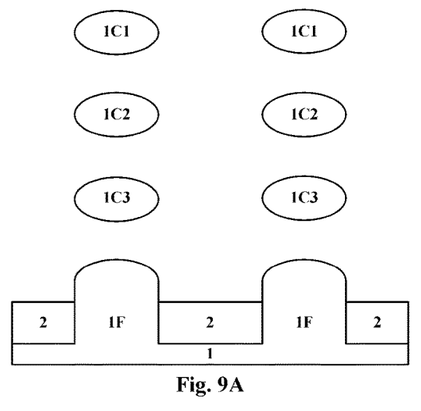
FIG. 9A is a cross sectional view, in a direction perpendicular to the channel direction, during an intermediate step of the method of manufacturing a stacked nanowires MOS transistor according to an embodiment of the disclosed technology.
Figure 9B:
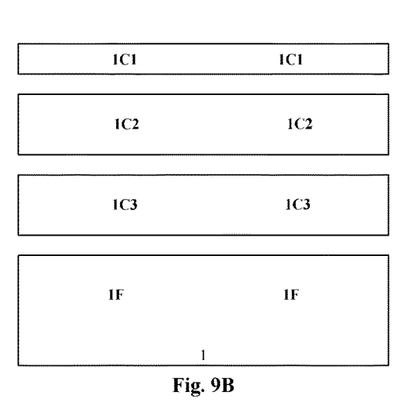
FIG. 9B is a cross sectional view, in a direction parallel to the channel direction, during an intermediate step of the method of manufacturing the stacked nanowires MOS transistor, corresponding to the intermediate step illustrated in FIG. 9A, according to an embodiment of the disclosed technology.

FIG. 9A is a cross sectional view, in a direction perpendicular to the channel direction (along a second direction), during an intermediate step of the method of manufacturing a stacked nanowires MOS transistor according to an embodiment of the disclosed technology. FIG. 9B is a corresponding cross sectional view in a direction parallel to the channel direction (along a first direction). By referring to FIG. 9A and FIG. 9B, a wet etching is utilized to remove the protective layers 1P1, 1P2, and 1P3 and so on and the hard mask layer HM. For example, a pyrophosphoric acid is utilized to remove silicon nitride, or a fluorhydric acid solution such a diluted fluorhydric acid solution is utilized to remove the protective layer of silicon nitride and the hard mask layer. Subsequently, in an embodiment, a process such as surface processing, sphering and the like is implemented to transfer the sectional shape of the nanowires 1C1, 1C2, 1C3 and so on formed by dry etching into a circular shape so as to enhance symmetry of the gate and channel region and to improve the uniformity of the device's property. The process of surface processing, sphering and so on is to utilize a surface oxidation and a wet micro-etching. The surface oxidation process comprises oxidation at a furnace temperature, oxidation by a solution of a strong oxidant. The process of surface processing, sphering and the like may be to bake at a high temperature and in a hydrogen atmosphere. The process of surface processing, sphering and the like may select isotropic etching of silicon and the like.

Figure 10A:
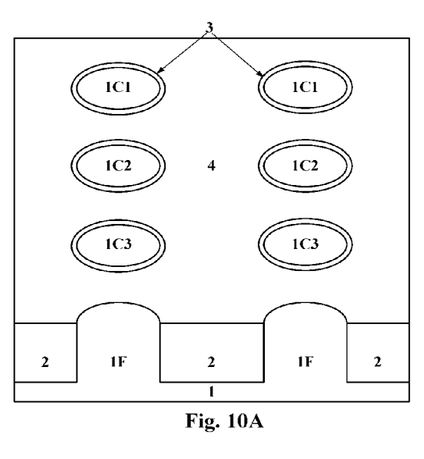
FIG. 10A is a cross sectional view, in a direction perpendicular to the channel direction, during an intermediate step of the method of manufacturing a stacked nanowires MOS transistor according to an embodiment of the disclosed technology.
Figure 10B:
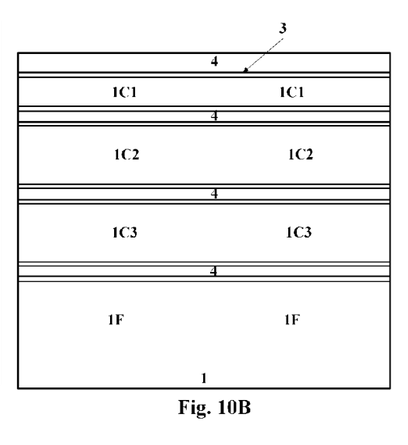
FIG. 10B is a cross sectional view, in a direction parallel to the channel direction, during an intermediate step of the method of manufacturing the stacked nanowires MOS transistor, corresponding to the intermediate step illustrated in FIG. 10A, according to an embodiment of the disclosed technology.

FIG. 10A is a cross sectional view, in a direction perpendicular to the channel direction (along a second direction), during an intermediate step of the method of manufacturing a stacked nanowires MOS transistor according to an embodiment of the disclosed technology. FIG. 10B is a corresponding cross sectional view in a direction parallel to the channel direction (along a first direction). By referring to FIG. 10A and FIG. 10B, a dummy gate stack is deposited on whole device. First of all, a pad oxide layer 3 of silicon oxide is deposited on the STI 2 and stacked nanowires 1C by a method such as low pressure chemical vapor deposition (LPCVD), PECVD, HDPCVD, RTO, chemical oxidation and the like, so as to protect the stacked nanowires 1C from being etched during subsequent etching process. A dummy gate layer 4 is formed on the pad oxide layer 3 by a deposition method such as PECVD, HDPCVD, metal organic chemical vapor deposition (MOCVD), molecular beam epitaxy (MBE), atomic layer deposition (ALD), evaporation, sputter and so on, and the material of the dummy gate layer may be one selected from polycrystalline silicon, amorphous silicon, crystallite silicon, amorphous carbon, polycrystalline germanium, amorphous germanium and any combination thereof. The thickness of the respective layers as mentioned above is not scale to the ratio shown in the figures and may be reasonably set according to the size and electronic characteristic of the particular device. The dummy gate stack 3/4 completely surrounds the respective nanowires 1C1-1C3 and the like.

Figure 11A:
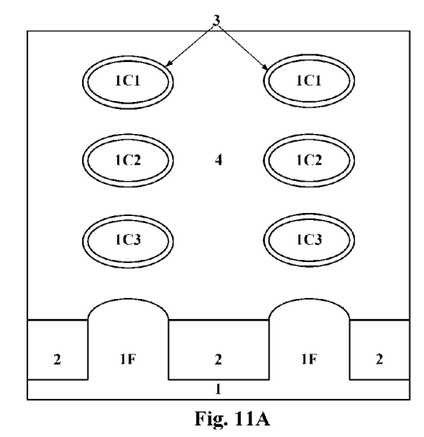
FIG. 11A is a cross sectional view, in a direction perpendicular to the channel direction, during an intermediate step of the method of manufacturing a stacked nanowires MOS transistor according to an embodiment of the disclosed technology.
Figure 11B:
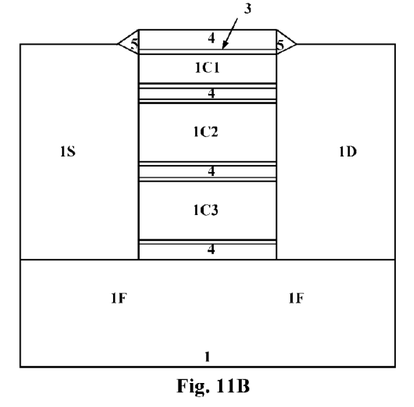
FIG. 11B is a cross sectional view, in a direction parallel to the channel direction, during an intermediate step of the method of manufacturing the stacked nanowires MOS transistor, corresponding to the intermediate step illustrated in FIG. 11A, according to an embodiment of the disclosed technology.

FIG. 11A is a cross sectional view, in a direction perpendicular to the channel direction (along a second direction), during an intermediate step of the method of manufacturing a stacked nanowires MOS transistor according to an embodiment of the disclosed technology. FIG. 11B is a corresponding cross sectional view in a direction parallel to the channel direction (along a first direction). By referring to FIG. 11A and FIG. 11B, source/drain regions are formed at both sides of the stack of nanowires 1C along the second direction. A mask (not shown) is formed on the middle portion of the stack of nanowires which functions as the channel region, and the stack of nanowires 1C is etched along the second direction until the substrate 1 is exposed. A raised source/drain regions 1S and 1D are formed by a selective epitaxial growing such as ultra-high vacuum chemical vapor deposition (UHVCVD), MOCVD, ALD, MBE, normal pressure epitaxial growing, the material of which may be identical to that of the substrate 1, i.e. silicon. For a PMOS device, the source/drain regions may be one selected from a group constituted of SiGe, SiSn, Si and any combination thereof, so that a compressive stress is applied to the channel region 1C so as to enhance the hole mobility. For a NMOS device, the source/drain regions may be one selected from a group constituted of Si:C, Si:H, SiGe:C, Si and any combination thereof, so that a tensile stress is applied to the channel region 1C so as to enhance the electron mobility. In and embodiment, an in-situ doping is implanted during epitaxial growing or an implantation doping is implemented after the epitaxial growing and then it is annealed to activate implanted dopant, so that the source/drain regions 1S/D have different doping type and concentration to control the electronic characteristic of the device. The top of the source/drain regions 1S/D is lower than that of the stack of nanowires 1C so as to expose at least the nanowires 1C1 at top. In an embodiment, a spacer 5 is formed at sides of the nanowires 1C1 along the second direction and the spacer 5 is used to form a lightly doped source/drain extending region and a heavily doped source/drain regions (not shown).

Figure 12A:
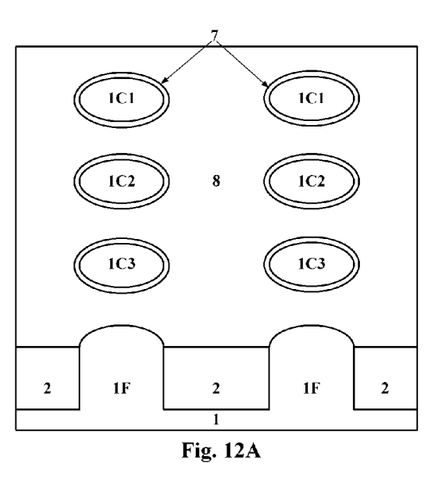
FIG. 12A is a cross sectional view, in a direction perpendicular to the channel direction, during an intermediate step of the method of manufacturing a stacked nanowires MOS transistor according to an embodiment of the disclosed technology.
Figure 12B:
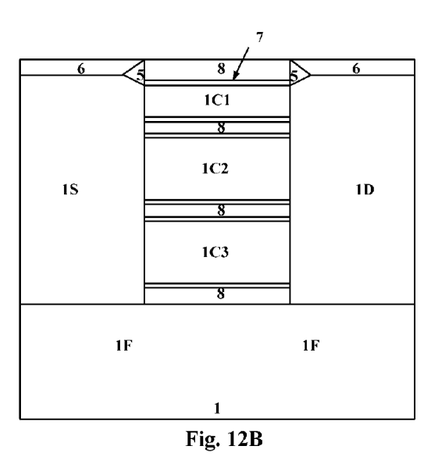
FIG. 12B is a cross sectional view, in a direction parallel to the channel direction, during an intermediate step of the method of manufacturing the stacked nanowires MOS transistor, corresponding to the intermediate step illustrated in FIG. 12A, according to an embodiment of the disclosed technology.

FIG. 12A is a cross sectional view, in a direction perpendicular to the channel direction (along a second direction), during an intermediate step of the method of manufacturing a stacked nanowires MOS transistor according to an embodiment of the disclosed technology. FIG. 12B is a corresponding cross sectional view, in a direction parallel to the channel direction (along a first direction). By referring to FIGS. 12A and 12B, the subsequent manufacturing intermediate steps are accomplished by utilizing a gate-last process. An interlayer dielectric (ILD) 6 of a low-k material is deposited on the device. The dummy gate stack 3/4 is removed by a wet etching and a gate trench (not shown) is left in the ILD 6. A gate insulating layer 7 of a high-k material and a gate conductive layer 8 of a metal material are deposited in turn in the gate trenches so as to form the gate stack arrangement. The gate stack arrangement is polarized (polished) by chemical mechanical planarization (CMP) until the ILD 6 is exposed. Subsequently, source/drain contract holes (not shown) is etched in the ILD 10 to the source/drain regions 1S/D. A barrier layer of a metal nitride and a conductive layer of a metal material are deposited in the source/drain contact holes to form source/drain contact plugs (not shown).

FIG. 13 is a stereo schematic view of a stacked nanowires MOSFET device according to the disclosed technology The device comprises: a plurality of stacks of nanowires extending along a first direction on a substrate; a plurality of metal gates extending along a second direction and across each of the stack of nanowires; a plurality of source/drain regions at both sides of the stack of nanowires extending along the first direction; a plurality of channel regions constituted of the stack of nanowires between the respective source/drain regions; wherein a metal gate surrounding the channel region. The material and geometry of the structures as mentioned above have been illustrated for the method, and here is omitted for brevity.

According to a stacked nanowires MOS transistor and the method of manufacturing the same, a stack of nanowires with an excellent quality is formed by a plurality of etching back, laterally etching a trench and filling the trench, which fully increases an equivalent width of a conductive channel at a lower cost and increases the driving current.

Figure 14:
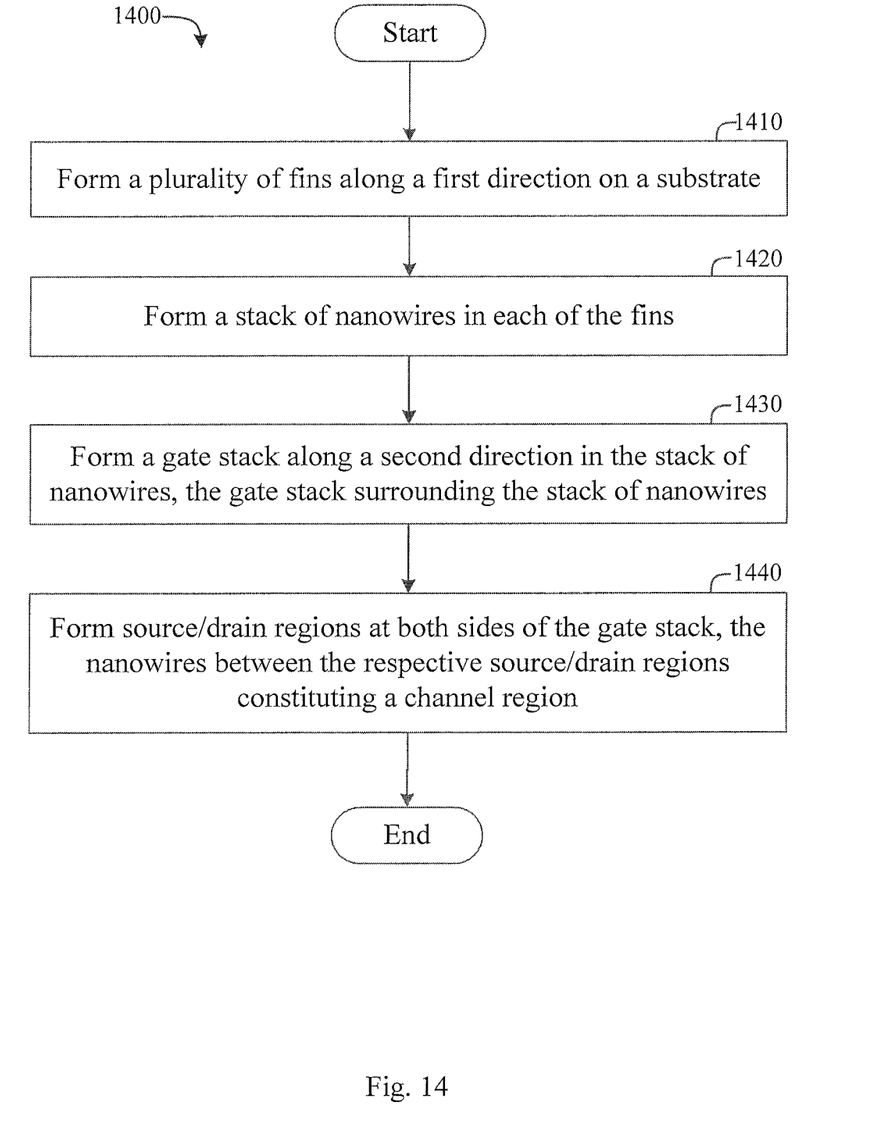
FIG. 14 is a flowchart illustrating an embodiment of manufacturing a stacked nanowires MOSFET device according to the disclosed technology.

FIG. 14 is a flowchart illustrating an embodiment of manufacturing a stacked nanowires MOSFET device according to the disclosed technology. In block 1410, method 1400 forms a plurality of fins along a first direction on a substrate. In block 1420, method 1400 forms a stack of nanowires in each of the fins. In block 1430, the method 1400 forms a gate stack along a second direction in the stack of nanowires, the gate stack surrounding the stack of nanowires. In block 1440, the method 1400 forms source/drain regions at both sides of the gate stack, the nanowires between the respective source/drain regions constituting a channel region.

The foregoing description does not explain technical details such as patterning and etching of each layer. However, one of ordinary skill in the art will understand that layers and regions of desired shapes can be formed using various known semiconductor process steps. Furthermore, processes different from those described above can be used to form the same structure. It is possible that features described in various embodiments could be combined.

The disclosed technology has been described above with reference to one or more example embodiments. It should be understood that various suitable alternations and equivalents can be made to the device structure and/or process by one skilled person in the art without departing from the spirits and scope of the disclosed technology. Moreover, the teachings of the disclosed technology may make various modifications which may be adapted for particular situations or materials without departing from the spirits and scope of the disclosed technology. Therefore, the object of the disclosed technology is not limited to the above particular embodiments of the disclosed technology. The device structure and the manufacture method thereof as disclosed will include all of embodiments falling within the scope of the claimed invention.

What is claimed is:

1. A method of manufacturing stacked nanowires MOS transistors, the method comprising:
    forming a plurality of fins along a first direction on a substrate;
    forming a stack of nanowires constituted of a plurality of nanowires in each of the fins, wherein forming the stack of nanowires in each of the fins comprises:
        depositing a shallow trench isolation between the fins,
        etching back the shallow trench isolation to expose a first portion on top of the fin,
        laterally etching the first portion on top of the fins to form a punched-through first recess, the remaining portion of the first portion on top of the fins forming first nanowires of the plurality of nanowires, and
        depositing a first protective layer to fill at least the first recess to form the first nanowires;
    and wherein after forming the first protective layer, the method further comprises at least one iteration of the following steps:
        anisotropically etching back the first protective layer and the shallow trench isolation to expose a second portion in a middle portion of the fins,
        laterally etching the second portion in the middle portion of the fins to form a punched through second recess, the remaining portion of the second portion in the fins constituting second nanowires of the plurality of nanowires, and
        depositing a second protective layer to fill at least the second recess;
    forming a gate stack along a second direction in the stack of nanowires, the gate stack surrounding the stack of nanowires; and
    forming source/drain regions at both sides of the gate stack, the nanowires between the respective source/drain regions constituting a channel region.

2. The method according to claim 1, wherein a shape for the first recess and/or the second recess comprises a rectangle, a trapezoid, a reversed trapezoid, a "Σ" shape, a "D" shape, a "C" shape, and/or a combination thereof.

3. The method according to claim 1, wherein laterally etching the fins comprises an isotropic plasma dry etching having a lateral etching depth or a combination of isotropic etching and anisotropic etching.

4. The method according to claim 1, wherein laterally etching the fins comprises a wet etching which utilizes a selective etching along different crystallographic directions and includes an etching of tetramethylammonium hydroxide (TMAH).

5. The method according to claim 1, wherein the material for the first protective layer and/or the second protective layer is different from that of the shallow trench isolation.

6. The method according to claim 1, wherein after forming the plurality of nanowires, the method further comprises:
    removing the first and/or second protective layers to expose the plurality of nanowires; and
    implementing a surface process and a sphering process on the stack of nanowires.

7. The method according to claim 1, wherein the gate stack is a dummy gate stack for a gate-last process.

8. The method according to claim 7, wherein after forming the source/drain region, the method further comprises:
    depositing an inter-layer dielectric layer;
    etching to remove the dummy gate stack to leave a gate trench; and
    depositing a gate stack in the gate trench.

9. The method according to claim 1, wherein foaming the source/drain regions further comprises:
    forming a mask in the in the middle portion of the stack of nanowires;
    etching the nanowires along the second direction until the substrate is exposed; and
    selectively epitaxial growing raised-up source/drain regions on the substrate.

10. The method according to claim 1, wherein after forming the first and/or second protective layers, the method further comprises anisotropically etching the protective layers to expose the first and/or second nanowires and the shallow trench isolation.

* * * * *

UNITED STATES PATENT AND TRADEMARK OFFICE
CERTIFICATE OF CORRECTION

PATENT NO. : 9,892,912 B2
APPLICATION NO. : 14/688788
DATED : February 13, 2018
INVENTOR(S) : Yin et al.

Page 1 of 1

It is certified that error appears in the above-identified patent and that said Letters Patent is hereby corrected as shown below:

In the Specification

In Column 2 at Line 38, Change "the a" to --a--.

In the Claims

In Column 12 at Line 46 (approx.), In Claim 9, change "foaming" to --forming--.

In Column 12 at Line 48 (approx.), In Claim 9, change "in the in the" to --in the--.

Signed and Sealed this
Seventeenth Day of July, 2018

Andrei Iancu
*Director of the United States Patent and Trademark Office*